(12) United States Patent
Hori et al.

(10) Patent No.: US 6,781,164 B2
(45) Date of Patent: Aug. 24, 2004

(54) SEMICONDUCTOR ELEMENT

(75) Inventors: Yuji Hori, Nagoya (JP); Tomohiko Shibata, Kasugai (JP); Osamu Oda, Nishikasugai-Gun (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/690,290

(22) Filed: Oct. 21, 2003

(65) Prior Publication Data

US 2004/0079964 A1 Apr. 29, 2004

Related U.S. Application Data

(62) Division of application No. 10/370,350, filed on Feb. 18, 2003, now Pat. No. 6,707,076, which is a division of application No. 10/007,099, filed on Dec. 4, 2001, now Pat. No. 6,583,468.

(51) Int. Cl.$^7$ ............................................. H01L 31/072
(52) U.S. Cl. ....................... 257/194; 257/192; 257/197; 257/198
(58) Field of Search ................................. 257/192, 194, 257/197, 198

(56) References Cited

U.S. PATENT DOCUMENTS

| | | | |
|---|---|---|---|
| 5,679,965 A | 10/1997 | Schetzina | |
| 5,810,925 A | 9/1998 | Tadatomo et al. | |
| 5,939,737 A | * 8/1999 | Hirano | ........................ 257/194 |
| 5,990,495 A | 11/1999 | Ohba | |
| 6,064,082 A | 5/2000 | Kawai et al. | |
| 6,252,255 B1 | 6/2001 | Ueta et al. | |
| 6,252,261 B1 | 6/2001 | Usui et al. | |
| 2003/0020092 A1 | 1/2003 | Pirikh et al. | |

FOREIGN PATENT DOCUMENTS

| | | |
|---|---|---|
| JP | 11-340147 | 12/1999 |
| WO | WO 98/35388 | 8/1998 |

OTHER PUBLICATIONS

M.A. Khan et al., "High Electron Mobility Transistor Based on a GaN–Al$_x$Ga$_{1-x}$N Heterojunction," Applied Physics Letters, Aug. 30, 1993, USA, vol. 63, No. 9, pp. 1214–1215, XP002269124.

P. Kung et al., "High Quality AlN and GaN Epilayers Grown on (pp. 1) Sapphire, (100) and (111) Silicon Substrates," Applied Physics Letters, American Institute of Physics, NY, US, vol. 66, No. 22, May 29, 1995, pp. 2958–2960, XP000507525.

* cited by examiner

*Primary Examiner*—David Nelms
*Assistant Examiner*—Mai-Huong Tran
(74) *Attorney, Agent, or Firm*—Burr & Brown

(57) ABSTRACT

An AlN film as an underlayer is epitaxially grown on a substrate having a dislocation density of $10^{11}$/cm$^2$ or below and a crystallinity of 90 seconds or below in full width at half maximum (FWHM) of an X-ray rocking curve at (002) reflection. Then, on the AlN film an n-GaN film is epitaxially grown as a conductive layer having a dislocation density of $10^{10}$/cm$^2$ or below and a crystallinity of 150 seconds or below in full width at half maximum (FWHM) of an X-ray rocking curve at (002) reflection, to fabricate a semiconductor element.

7 Claims, 1 Drawing Sheet

SEMICONDUCTOR ELEMENT

CROSS REFERENCE TO RELATED APPLICATIONS

This application is a division of U.S. application Ser. No. 10/370,350 filed Feb. 18, 2003, now U.S. Pat. No. 6,707,076 which in turn is a division of U.S. application Ser. No. 10/007,099 filed Dec. 4, 2001, now U.S. Pat. No. 6,583,468, the entireties of which are incorporated herein by reference.

BACKGROUND OF THE INVENTION

1. Field of the Invention

This invention relates to a semiconductor element, particularly usable for a field-effect transistor (FET), a high electron mobility transistor (HEMT), a heterojunction bipolar transistor (HBT) or the like.

2. Related Art Statement

With the recent development of cellular phone and optical communication techniques, low electric power consumable and high output electronic devices having high frequency properties are remarkably desired. As such an electronic device, conventionally, Si and GaAs devices have been employed. However, since these devices do not have sufficiently high frequency properties, a new high output electronic device is keenly desired.

In this point of view, a HEMT and a psudemorphic HEMT which are made of GaAs-based semiconductors are developed and practically used. Moreover, high performance electronic devices such as a HEMT and a HBT made of InP-based semiconductor have been researched and developed.

However, such a high performance electronic device is composed of plural semiconductor layers epitaxially grown on a given substrate, and has a very complicated structure. Moreover, micro processing techniques are required in fabricating the electron device, so that the manufacturing cost of the electronic device rises. In addition, the InP-based semiconductor is very expensive, so alternatives are desired.

In this point of view, recently, much attention is paid to a new electron device made of a GaN-based semiconductor. Since the bandgap of the GaN semiconductor is 3.39 eV, the GaN semiconductor can have a dielectric breakdown voltage tenfold as large as that of a GaAs semiconductor and a Si semiconductor. Moreover, because the GaN semiconductor can have a large electron saturated drift velocity, it can have a larger performance index as an electronic device than a GaAs semiconductor and a Si semiconductor. Therefore, a GaN semiconductor is prospected as a fundamental semiconductor for high temperature devices, high output devices and high frequency devices in engine controlling, electrical power converting and mobile communication techniques.

Particularly, since an electronic device with an HEMT structure made of an AlGaN or GaN semiconductor is developed by Khan et al. and published in "J. Appl. Phys. Lett.," 63(1993), pp1214–1215, such an electronic device using GaN-based semiconductor has been intensely researched and developed all over the world. Such an electronic device is generally formed by epitaxially growing given semiconductor layers on a sapphire substrate.

However, since the lattice mismatch between the GaN-based semiconductor layer and the sapphire substrate is large, many misfit dislocations are created at the boundary between the semiconductor layer and substrate, and, propagated in the semiconductor layer. As a result, many dislocations on the order of $10^{10}/cm^2$ are created in the semiconductor layer, and thus, the electrical properties of the electronic device including the semiconductor layer are deteriorated. Therefore, under the present conditions, the performance of the electronic device made of a GaN-based semiconductor can not be sufficiently improved.

In order to improve the crystal quality of the GaN-based semiconductor layer, an attempt has been made to form a buffer layer between the semiconductor layer and the sapphire substrate or to employ a SiC substrate, a GaN substrate and other oxide substrates instead of the sapphire substrate, but the crystal quality of the GaN-based semiconductor layer formed on the substrate can not be sufficiently improved.

Moreover, an ELO (epitaxial layer overgrowth) technique, such as forming a strip mask made of $SiO_2$, etc. on a substrate has been developed. In this case, misfit dislocations created at the boundary between the GaN-based semiconductor layer and the substrate are laterally propagated in the region above the strip mask, and thus, the dislocation density of the semiconductor layer is decreased in between the adjacent strip portions of the mask.

However, since the ELO technique requires a complicated process, the manufacturing cost of the electronic device rises. Moreover, since the GaN semiconductor layer must be formed thicker so as to cover the strip mask, the substrate may be warped. If the ELO technique is employed in the practical process for manufacturing electron devices including the GaN-based semiconductor layers, most of the substrates to be employed and constituting the electronic devices are warped and thus, broken. Therefore, the ELO technique can not be employed in the practical manufacturing process for the electronic device.

SUMMARY OF THE INVENTION

It is an object of the present invention to decrease the dislocation density of a an epitaxially grown semiconductor layer made of a nitride including at least one element selected from the group consisting of Al, Ga, and In, and thus, to provide a semiconductor element including a semiconductor layer usable as a practical device, such as a FET and a HEMT.

In order to achieve the above object, this invention relates to a semiconductor element (a first semiconductor element), substantially including a substrate, an underlayer epitaxially grown on the substrate and made of a first semiconductor nitride including at least elemental Al. The dislocation density of the underlayer is set to $10^{11}/cm^2$ or below, and the crystallinity of the underlayer is set to 90 seconds or below in full width at half maximum of an X-ray rocking curve at (002) reflection. A conductive layer is also included, epitaxially grown on the underlayer and made of a second semiconductor nitride including at least one element selected from the group consisting of Al, Ga and In. The dislocation density of the conductive layer is set to $10^{10}/cm^2$ or below, and the crystallinity of the conductive layer is set to 150 seconds or below in full width at half maximum of an X-ray rocking curve at (002) reflection.

This invention also relates to a semiconductor element (a second semiconductor element), substantially including a substrate, and an underlayer epitaxially grown on the substrate, made of a first semiconductor nitride including at least one element selected from the group consisting of Al, Ga and In. The dislocation density of the underlayer is set to $10^{11}/cm^2$ or below, and the crystallinity of the underlayer is set to 90 seconds or below in full width at half maximum of an X-ray rocking curve at (002) reflection. A carrier moving layer is also included, epitaxially grown on the underlayer, made of a second semiconductor nitride including at least one element selected from the group consisting of Al, Ga and In. The dislocation density of the carrier moving layer is set to $10^{10}/cm^2$ or below, and the crystallinity of the carrier moving layer is set to 150 seconds or below in full width at half maximum of an X-ray rocking curve at (002) reflection. Further, a carrier supplying layer is also included, epitaxially grown on the carrier moving layer and made of a third semiconductor nitride including at least one element selected from the group consisting of Al, Ga and In.

Moreover, this invention relates to a semiconductor element (a third semiconductor element), substantially including a substrate, and an underlayer, epitaxially grown on the substrate, made of a first semiconductor nitride including at least one element selected from the group consisting of Al, Ga and In. The dislocation density of the underlayer is set to $10^{11}/cm^2$ or below, and the crystallinity of the underlayer is set to 90 seconds or below in full width at half maximum of an X-ray rocking curve at (002) reflection. A first conductive layer of a first conduction type is provided, epitaxially grown on the underlayer and made of a second semiconductor nitride including at least one element selected from the group consisting of Al, Ga and In. The dislocation density of the first conductive layer is set to $10^{10}/cm^2$ or below, and the crystallinity of the first conductive layer is set to 150 seconds or below in full width at half maximum of an X-ray rocking curve at (002) reflection. A second conductive layer of the first conduction type is also provided, epitaxially grown on the first conductive layer and made of a third semiconductor nitride including at least one element selected from the group consisting of Al, Ga and In. The dislocation density of the second conductive layer is set to $10^{10}/cm^2$ or below, and the crystallinity of the second conductive layer is set to 90 seconds or below in full width at half maximum of an X-ray rocking curve at (002) reflection. A third conductive layer of a second conduction type opposite to the first conduction type is also provided, epitaxially grown on the second conductive layer and made of a fourth semiconductor nitride including at least one element selected from the group consisting of Al, Ga and In. The dislocation density of the third conductive layer is set to $10^{10}/cm^2$ or below, and the crystallinity of the third conductive layer is set to 150 seconds or below in full width at half maximum of an X-ray rocking curve at (002) reflection. Further, a fourth conductive layer of the first conduction type is provided, epitaxially grown on the third conductive layer, made of a fifth semiconductor nitride including at least one element selected from the group consisting of Al, Ga and In. The dislocation density of the fourth conductive layer is set to $10^{10}/cm^2$ or below, and the crystallinity of the fourth conductive layer is set to 150 seconds or below in full width at half maximum of an X-ray rocking curve at (002) reflection.

The inventors have intensely studied epitaxial growing techniques, particularly, epitaxially growing an AlN film on a sapphire substrate, for a long time. In this process, the inventors found out that if the AlN film is epitaxially grown on the sapphire substrate by employing specific conditions, misfit dislocations are entwined at the boundary between the film and the substrate though the misfit dislocations are created at the boundary, and thus, are not propagated in the film.

Therefore, the dislocation density of the AlN film epitaxially grown can be reduced, and thus, the crystal quality of the AlN film can be developed. Such an astonishing phenomena can not be observed under conventional conditions for epitaxially growing AlN films. Concretely, the dislocation density of the AlN film can be reduced to $10^{11}/cm^2$ or below, and the crystallinity of the AlN film can be enhanced to 90 seconds or below in full width at half maximum (FWHM) of an X-ray rocking curve.

Moreover, the inventors found out that if a GaN film is formed on the AlN film, the dislocations in the AlN film are entwined at the boundary between the AlN film and the GaN film due to the difference in lattice constant there-between, and thus, can not be propagated in the GaN film. Therefore, the dislocation density of the GaN film can be reduced to $10^{10}/cm^2$ or below, and the crystallinity of the GaN film can be enhanced to 150 seconds or below in FWHM of an X-ray rocking curve.

If the AlN film is employed as an underlayer and a semiconductor film made of a nitride and constituting a conductive layer is epitaxially grown on the underlayer, the crystallinity of the semiconductor layer is improved, originating from the high crystallinity of the underlayer and the dislocation density of the semiconductor layer being improved. As a result, the electrical properties, such carrier mobility, of the conductive layer made of the semiconductor layer can be enhanced.

The semiconductor element of the present invention conceived from the long-term research and development as mentioned above can be employed as a practical device such as a FET, a HEMT and a HBT. Then, it has been expected to employ such a semiconductor element having a semiconductor layer made of a nitride including at least one element selected from the group consisting of Al, Ga and In as a practical device such as a FET, a HEMT and a HBT.

On the other hand, if the above-mentioned ELO technique is employed, a semiconductor layer made of a nitride and having a relatively low dislocation density can be epitaxially grown on a given substrate. Therefore, an underlayer and a conductive layer having a relatively high crystallinity and a relatively low dislocation density can be also fabricated. However, finally, a $SiO_2$ mask remains in the resulting semiconductor element fabricated by using the ELO technique.

In this point of view, in the present invention, the wording "substantially comprising" means "not including such an unnecessary component as a mask in a semiconductor element." Since such an unnecessary component is not included in the first through the third semiconductor elements, their semiconductor elements are different from the one fabricated by using the ELO technique.

The first semiconductor element can be preferably employed as a practical device such as a FET, and the second semiconductor element can be preferably employed as a practical device such as a HEMT. The third semiconductor element can be preferably employed as a practical device such as a HBT.

BRIEF DESCRIPTION OF THE DRAWINGS

For better understanding of the present invention, reference is made to the attached drawings, wherein.

DETAILED DESCRIPTION OF THE INVENTION

Figure 1:
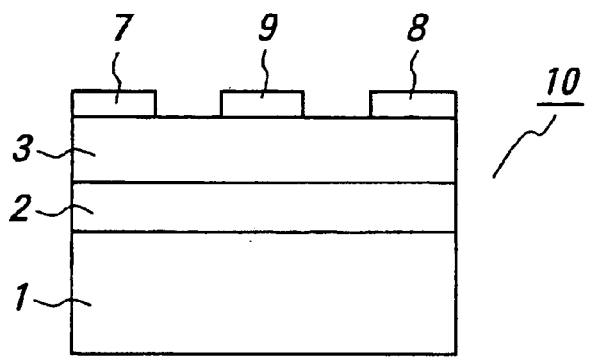
FIG. 1 is a cross sectional view showing a FET made of a first semiconductor element according to the present invention.

This invention will hereinafter be described in detail. FIG. 1 is a cross sectional view showing a FET made of a first semiconductor element according to the present invention. The FET 10 depicted in FIG. 1 includes a substrate 1, an underlayer 2 made of AlN as a first semiconductor nitride epitaxially grown on the substrate 1, and a conductive layer 3 made of n-GaN as a second semiconductor nitride epitaxially grown on the underlayer 2. In this case, the first semiconductor element is composed of the substrate 1, the underlayer 2 and the conductive layer 3. On the conductive layer 3 are formed a source electrode 7 and a drain electrode 8 having ohmic-contact property and, for example, made of a Ti/Al/Pt/Au multilayered structure. In addition, on the conductive layer 3 is formed a gate electrode 9 having ohmic-contact property and, for example, made of a Ni/Pt/Au multilayered structure.

In the FET 10 depicted in FIG. 1, it is required that the dislocation density of the underlayer 2 made of AlN is set to $10^{11}/cm^2$ or below, preferably $10^{10}/cm^2$ or below. In this case, the dislocation density of the conductive layer 3 made of n-GaN can be reduced to $10^{10}/cm^2$ or below, preferably $10^9/cm^2$ or below, and as a result, the electrical properties, such as carrier mobility, can be enhanced.

It is desired that the dislocation density of the conductive layer 3 is reduced as low level as possible, and as of now, can be reduced to about $10^8/cm^2$.

It is required that the crystallinity of the underlayer 2 made of AlN is set to 90 seconds or below, preferably 50 seconds or below in FWHM of an X-ray rocking curve at (002) reflection. In this case, the crystallinity of the conductive layer 3 can be enhanced to 150 seconds or below, particularly 100 seconds or below in FWHM of an X-ray rocking curve at (002) reflection, originating from the higher crystallinity of the underlayer 2.

The crystallinity and the crystal quality due to the low dislocation density can be enhanced, and thus, the electrical properties, such as mobility in the conductive layer 3, can also be enhanced.

An AlN film constituting the underlayer 2 is made by supplying trimethylaluminum (TMA) and a ammonia ($NH_3$) as raw material gases onto a given substrate heated to preferably 1100° C. or over, particularly 1200° C. or over.

Conventionally, an underlayer is made of a GaN-based semiconductor not including elemental Al, and thus, the formation temperature is set between 1000° C. and 1100° C. On the contrary, the underlayer constituting the semiconductor element of the present invention is made of a nitride including at least elemental Al , preferably 50 atomic percentages of elemental Al for all of the Group IIIA elements of the nitride, and particularly made of AlN as shown in FIG. 1.

Then, as mentioned above, the underlayer of the semiconductor element of the present invention is preferably formed at 1100° C. or over, which is much higher than the conventional formation temperature. That is, the underlayer can be made by employing quite different conditions such as the conditions in a conventional MOCVD method. Herein, the "formation temperature" means "the temperature of the substrate on which the underlayer is formed."

Although the upper limit value of the formation temperature of the underlayer is not limited, it is preferably set to 1250° C. In this case, the surface roughness of the underlayer due to the material composition thereof can be inhibited, and the diffusion of the components of the underlayer can be also inhibited. As a result, the crystal quality of the underlayer can be developed, irrespective of the material composition of the underlayer, and thus, the crystal quality of the conductive layer can be also developed.

In view of the enhancement of the crystallinity of the underlayer 2, it is more preferable that the thickness of the underlayer is increased. However, if the underlayer 2 is formed too thick, some cracks may be created in the underlayer 2, and the underlayer 2 may break away from on the substrate. Therefore, it is desired that the thickness of the underlayer 2 is set to 0.5 μm or over, particularly within a range of 1–3 μm.

The substrate 1 may be made of an oxide single crystal, such as a sapphire single crystal, ZnO single crystal, $LiAlO_2$ single crystal, $LiGaO_2$ single crystal, $MgAl_2O_4$ single crystal, or MgO single crystal, a Group IV single crystal or a Group IV-IV single crystal such as Si single crystal or SiC single crystal, a Group III-V single crystal such as GaAs single crystal, AlN single crystal, GaN single crystal or AlGaN single crystal, and a boride single crystal such as $ZrB_2$.

Particularly, in the case of making the substrate of a sapphire single crystal, it is desired that surface-nitriding treatment is performed on the main surface for the underlayer 2. The surface-nitriding treatment is performed as follows. First of all, the sapphire single crystal substrate is set in a nitrogen-including atmosphere, such as an ammonia atmosphere, and heated for a given period. The thickness of the resulting surface nitride layer can be adjusted by controlling the nitrogen concentration, the nitriding temperature and the nitriding period appropriately.

If the sapphire single crystal substrate having the surface nitriding layer thereon is employed, the crystallinity of the underlayer 2 formed directly on the main surface can be more enhanced. Moreover, since the underlayer 2 can be easily formed thicker without cracks and breakaway, for example, up to 3 μm of the upper limit value in the above-mentioned preferable thickness range, not by using a specific forming condition, the crystallinity of the underlayer 2 can be more easily enhanced due to the increase in thickness. As a result, the crystal quality of the underlayer can be much more enhanced due to the higher crystallinity originating from the surface nitriding layer.

Consequently, the crystal quality of the conductive layer 3 formed on the underlayer 2 can be developed, and thus, the dislocation density of the conductive layer 3 can be more reduced.

In addition, if the sapphire single crystal having the surface nitriding layer is employed, the higher crystal quality of the underlayer 2 can be maintained even though the underlayer 2 is made even at 1200° C. or below, particularly around 1150° C., within the above-mentioned preferable formation temperature range. Concretely, in this case, the dislocation density of the underlayer 2 can be easily reduced to $10^{10}/cm^2$ or below.

It is desired that the surface-nitriding layer is formed thicker, for example, so that the nitrogen content of the sapphire single crystal substrate at a depth of 1 nm from the main surface is set to two atomic percentages or over, in ESCA analysis. Moreover, the surface-nitriding layer may be formed thinner, for example, in a thickness of 1 nm or below.

In the case of making the underlayer thicker, some tensile stresses may be exerted on the underlayer and thus, some cracks may be created in the underlayer. In this case, it is desired that the material composition is varied continuously or stepwisely from the substrate toward the conductive layer. Thereby, the lattice constant of the underlayer can be matched appropriately to the ones of the conductive layer and the substrate, resulting in the reduction of tensile stress for the underlayer and thus, the inhibition of the creation of cracks.

For example, as shown in FIG. 1, in the case of making the conductive layer 3 of n-GaN, the underlayer 2 is made of AlGaN. Then, the Al content of the underlayer 2 is decreased from the substrate 1 toward the conductive layer 3, and the Ga content of the underlayer 2 is increased from the substrate 1 toward the conductive layer 3.

As shown in FIG. 1, since a $SiO_2$ mask or the like is not included, the substrate 1, that is, the FET 10 as a semiconductor element, is not subject to significant warping. Concretely, in the case that the substrate 1 has a diameter of two inches (about 5 cm), the degree of warping of the first semiconductor element constituting the FET 10 can be reduced to only 100 μm or below, particularly 50 μm or below.

Figure 2:
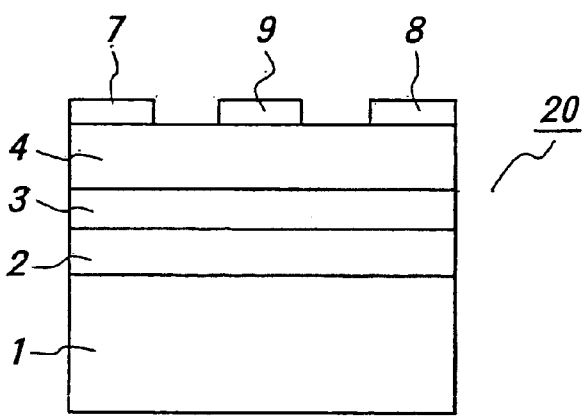
FIG. 2 is a cross sectional view showing a HEMT made of a second semiconductor element according to the present invention.

FIG. 2 is a cross sectional view showing a HEMT made of a second semiconductor element according to the present invention. The same reference numerals are given to the similar constituent portions to the ones of the FET 10 shown in FIG. 1.

The HEMT 20 depicted in FIG. 2 includes a carrier moving layer 3 instead of the conductive layer 3 and a carrier supplying layer 4 made of n-AlGaN as a third semiconductor nitride and formed on the carrier moving layer 3. However, it is required that an underlayer 2 is formed in the same manner as the one of the FET 10, and thus, the same conditions are required for the underlayer 2. The substrate 1 may be also made of a single crystal as mentioned above, and in the case of using the sapphire single crystal, the surface-nitriding treatment is preferably performed for the main surface of the sapphire single crystal substrate. In this case, the second semiconductor element is composed of the substrate 1, the underlayer 2, the carrier moving layer 3 and the carrier supplying layer 4. Moreover, a source electrode 7, a drain electrode 8 and a gate electrode 9 may be made in the same manner as the ones of the FET 10. In the HEMT 20, carriers are supplied into the carrier moving layer 3 from the carrier supplying layer 4, and moved in the surface region of the carrier moving layer 3.

Moreover, in order to inhibit the creation of cracks, it is desired that the material composition of the underlayer 2 is varied continuously or stepwisely from the substrate I toward the carrier moving layer 3.

Then, since a $SiO_2$ mask or the like is not included, the substrate 1 is not subject to significant warping. Concretely, the degree of warping of the second semiconductor element constituting the HEMT 20 can be reduced to 100 μm or below, particularly 50 μm or below if the diameter of the substrate 1 is set to two inches (about 5 cm).

Figure 3:
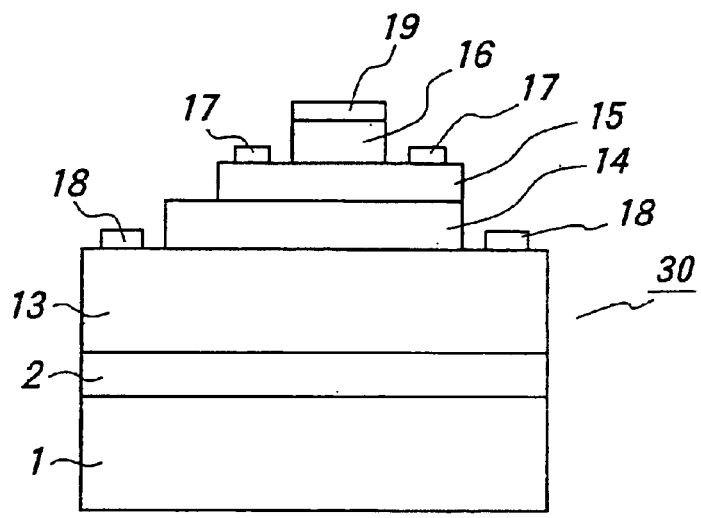
FIG. 3 is a cross sectional view showing a HBT made of a third semiconductor element.

FIG. 3 is a cross sectional view showing a HBT made of a third semiconductor element. The same reference numerals are given to the similar constituent portions to the ones of the FET 10 shown in FIG. 1.

The HBT 30 depicted in FIG. 3 includes a substrate 1, an underlayer 2 made of AlN as a first semiconductor nitride and epitaxially grown on the substrate 1, and a first conductive layer 13 of a first conduction type made of n-GaN as a second semiconductor nitride.

The HBT 30 also includes, on the first conductive layer 13, a second conductive layer 14 of the first conduction type made of n-GaN as a third semiconductor nitride, and a third conductive layer 15 of a second conduction type made of $P^+$-GaN as a fourth semiconductor nitride. Moreover, the HBT 30 includes, on the third conductive layer 15, a fourth conductive layer 16 of the first conductive type made of $n^+$-AlGaN as a fifth semiconductor nitride. As a result, the HBT 30 has an npn-type junction structure. In this case, the third semiconductor element is composed of the substrate 1, the underlayer 2, and the first through the fourth conductive layers 13–15.

On the exposed surface of the first conductive layer 13 is formed a collector electrode 18 made of a Ti/Al/Pt/Au multilayered structure, and on the exposed surface of the third conductive layer 15 is formed a base electrode 17 made of a Ni/Pt/Au multilayered structure. On the fourth conductive layer 16 is formed an emitter electrode 19 made of a similar Ti/Al/Pt/Au multilayered structure.

It is required that the underlayer 2 is formed in the same manner as the one of the FET 10, and thus, the same conditions are required for the underlayer 2. As a result, the dislocation densities of the first through the fourth conductive layers can be reduced to $10^{10}/cm^2$ or below, particularly $10^9/cm^2$ or below. Moreover, the crystallinities of the first through the fourth conductive layers can be developed to 90 seconds or below, particularly 50 seconds or below in FWHM of an X-ray rocking curve at (002) reflection. Therefore, the crystal qualities of the first through the fourth conductive layers can be enhanced, and thus, the electrical properties, such as carrier mobility, can be enhanced. The substrate 1 may be also made of a single crystal as mentioned above, and in the case of using the sapphire single crystal, the surface-nitriding treatment is preferably performed for the main surface of the sapphire single crystal substrate.

As mentioned above, in the case that the lattice constant of the underlayer 2 is largely different from the one of the substrate 1 and/or the first conductive layer 13, it is desired that the material composition of the underlayer 2 is varied continuously or stepwisely from the substrate 1 toward the first conductive layer 13 in order to inhibit the creation of cracks. The substrate 1 may be made of the same single crystal as mentioned above.

Then, since a $SiO_2$ mask or the like is not included, the substrate 1 is not subject to significant warping. Concretely, the degree of warping of the third semiconductor element constituting the HBT 30 can be reduced to 100 μm or below, particularly 50 μm or below if the diameter of the substrate 1 is set to two inches (about 5 cm).

It is required in the present invention that the semiconductor layers constituting the semiconductor elements such as a FET, a HEMT and a HBT shown in FIGS. 1–3 are made of nitrides including at least one element selected from the group consisting of Al, Ga and In. In addition, the nitrides that constitute the semiconductor layers may also include an additive element such as Ge, Si, Mg, Zn, Be, P or B as occasion demands, and a minute impurity contained in the raw material gases and the reactor or contained depending on the forming condition.

Such a semiconductor element as a FET, a HEMT and a HBT shown in FIGS. 1–3 may be fabricated by a conventional method only if the underlayers and the conductive layers are made under the conditions required by the present invention.

Examples: This invention will be concretely described, hereinafter by way of example.

EXAMPLE 1

A sapphire single crystal substrate having a diameter of 2 inches and a thickness of 430 μm was employed, and thus, pre-treated by $H_2SO_4+H_2O_2$, and set into a MOCVD apparatus. To the MOCVD apparatus was attached a gas system of $H_2$, $N_2$, TMA, TMG, $NH_3$ and $SiH_4$. Then, the substrate was heated to 1200° C. with $H_2$ gas flowing at a rate of 1 m/sec. Thereafter, an ammonia gas (NH$_3$) was flown with a H$_2$ carrier gas for five minutes, to nitride the main surface of the substrate. In ESCA analysis, it turned out that a surface-nitriding layer was formed on the main surface by the surface-nitriding treatment, and the nitrogen content at the depth of 1 nm from the main surface was seven atomic percentages.

Then, a TMA and a NH$_3$ were flown at an average rate of 10 m/sec, to epitaxially grow an AlN film in a thickness of 1 μm as an underlayer. The dislocation density of the AlN film was 8×10$^9$/cm$^2$, and the FWHM in an X-ray rocking curve of the AlN film was 90 seconds. As a result, the good crystal quality of the AlN film was confirmed. Moreover, the surface roughness Ra of the AlN film was 2 Å within a 5 μm area, and thus, the good surface flatness of the AlN film was also confirmed.

Then, a TMG, a NH$_3$ and a SiH$_4$ were flown at an average rate of 1 m/sec, to epitaxially grow a Si-doped n-GaN film as a conductive layer. The dislocation density of the n-GaN film was 2×10$^8$/cm$^2$, and the FWHM in an X-ray rocking curve of the n-GaN film was 120 seconds at (002) reflection. Moreover, the carrier density of the n-GaN film was 8×10$^{16}$/cm$^3$, and the mobility at room temperature was 800 cm$^2$/V·sec.

Then, a source electrode and a drain electrode of a Ti/Al/Pt/Au multilayered structure were fabricated on the n-GaN film, and a gate electrode of a Ni/Pt/Au multilayered structure was fabricated on the n-GaN film. Herein, the gate length and the gate width were set to 0.5 μm and 70 μm, respectively.

When the high frequency performance of the thus obtained FET was examined, the cut-off frequency ft was 30 GHz. Therefore, it was confirmed that the FET has an extremely high frequency performance.

EXAMPLE 2

After a surface nitriding treatment was carried out for a sapphire substrate in the same manner as Example 1, an AlN film and an i-GaN film were epitaxially grown subsequently, as an underlayer and a carrier moving layer, respectively. The dislocation densities the AlN film and the i-GaN film were 8×10$^9$/cm$^2$, and 2×10$^8$/cm$^2$, respectively, and the FWHMs in an X-ray rocking curve at (002) reflection of the AlN film and the i-GaN film were 90 seconds and 120 seconds, respectively.

Then, a TMA, a TMG and a NH$_3$ were flown at an average rate of 3 m/sec, to epitaxially grow, on the i-GaN film, an n-AlGaN film as a carrier supplying layer.

Thereafter, a source electrode and a drain electrode of a Ti/Al/Pt/Au multilayered structure were fabricated on the n-AlGaN film, and a gate electrode of a Ni/Pt/Au multilayered structure was fabricated on the n-AlGaN film. Herein, the gate length and the gate width were set to 0.5 μm and 70 μm, respectively.

The mobility of the thus obtained HEMT at room temperature was 2000 cm$^2$/V·sec. When the high frequency performance of the HEMT was examined, the cut-off frequency ft was 60 GHz. Therefore, it was confirmed that the HEMT has an extremely high frequency performance.

As is apparent from Examples 1 and 2, the FET and the HEMT according to the present invention can have extreme electrical properties such as carrier concentration and mobility, and can exhibit extremely high frequency performances. In the other words, the semiconductor element of the present invention can be used as a practical device such as a FET and a HEMT.

Although the present invention was described in detail with reference to the above examples, this invention is not limited to the above disclosure and every kind of variation and modification may be made without departing from the scope of the present invention. For example, the thickness and the material composition of the semiconductor layer may be appropriately determined. Moreover, the carrier concentration of the conductive layer may be appropriately determined.

Then, in the HEMT 20 shown in FIG. 2, an i-AlGaN film may be formed as a spacer to prevent the diffusion of elemental Si between the carrier moving layer 3 and the carrier supplying layer 4. Moreover, an n-GaN film may be formed on the carrier supplying layer 4 as a contact layer to reduce the electric contact resistances of the electrodes. Furthermore, in order to prevent the diffusion of elemental Si, a barrier layer may be formed between the carrier supplying layer 4 and the contact layer.

In the HBT 30 shown in FIG. 3, although the HBT 30 has an npn-type junction structure, it may have a pnp-type junction structure by changing the conduction types of the semiconductor layers of the HBT 30. Moreover, for developing the crystal qualities of the conductive layers 13–16 formed on the underlayer 2, a buffer layer or a multilayered structure such as a distorted superlattice structure may be provided between the underlayer 2 and the conductive layer 13.

As mentioned above, since the semiconductor element of the present invention has an underlayer of low dislocation density and high crystallinity, and a conductive layer of high crystal quality originating from the underlayer, the electrical properties of the semiconductor element can be enhanced. Therefore, the semiconductor element can be used, as a semiconductor device having semiconductor layers including at least one element selected from the group consisting of Al, Ga and In, for practical devices.

What is claimed is:

1. A semiconductor element, substantially comprising:
    a substrate,
    an underlayer, epitaxially grown on the substrate, made of a first semiconductor nitride including at least one element selected from the group consisting of Al, Ga and In, the dislocation density of the underlayer being set to 10$^{11}$/cm$^2$ or below, the crystallinity of the underlayer being set to 90 seconds or below in full width at half maximum of X-ray rocking curve at (002) reflection,
    a first conductive layer of a first conduction type, epitaxially grown on the underlayer, made of a second semiconductor nitride including at least one element selected from the group consisting of Al, Ga and In, the dislocation of the first conductive layer being set to 10$^{10}$/cm$^2$ or below, the crystallinity of the first conductive layer being set to 150 seconds or below in full width at half maximum of X-ray rocking curve at (002) reflection,
    a second conductive layer of the first conduction type, epitaxially grown on the first conductive layer, made of a third semiconductor nitride including at least one element selected from the group consisting of Al, Ga and In, the dislocation of the second conductive layer being set to 10$^{10}$/cm$^2$ or below, the crystallinity of the second conductive layer being set to 90 seconds or below in full width at half maximum of X-ray rocking curve at (002) reflection,
    a third conductive layer of a second conduction type opposite to the first conduction type, epitaxially grown on the second conductive layer, made of a fourth semiconductor nitride including at least one element selected from the group consisting of Al, Ga and In, the dislocation of the third conductive layer being set to $10^{10}/cm^2$ or below, the crystallinity of the third conductive layer being set to 150 seconds or below in full width at half maximum of X-ray rocking curve at (002) reflection, and a fourth conductive layer of the first conduction type, epitaxially grown on the third conductive layer, made of a fifth semiconductor nitride including at least one element selected from the group consisting of Al, Ga and In, the dislocation of the fourth conductive layer being set to $10^{10}/cm^2$ or below, the crystallinity of the fourth conductive layer being set to 150 seconds or below in full width at half maximum of X-ray rocking curve at (002) reflection.

2. A semiconductor element as defined in claim 1, wherein the underlayer is formed at 1100° C. or over by a MOCVD method.

3. A semiconductor element as defined in claim 2, wherein the underlayer is formed at a temperature within 1100–1250° C.

4. A semiconductor element as defined in claim 1, wherein the substrate is made of a sapphire single crystal having a surface nitride layer on the main surface of the crystal, and the underlayer is formed on the main surface via the surface nitride layer.

5. A semiconductor element as defined in claim 1, wherein the material composition of the first semiconductor nitride constituting the underlayer is varied continuously or stepwisely from the substrate toward the conductive layer.

6. A semiconductor element as defined in claim 1, wherein the warp of the semiconductor element is 100 μm or below per 5 cm length.

7. A heterojunction bipolar transistor comprising a semiconductor element, an emitter electrode, a collector electrode and a base electrode which are provided on the semiconductor element.

* * * * *

UNITED STATES PATENT AND TRADEMARK OFFICE
CERTIFICATE OF CORRECTION

PATENT NO. : 6,781,164 B2
DATED : August 24, 2004
INVENTOR(S) : Yuji Hori et al.

It is certified that error appears in the above-identified patent and that said Letters Patent is hereby corrected as shown below:

<u>Title page,</u>
After Item [62] and before Item [51], add Item:

-- [30]     Foreign Application Priority Data

| Dec. 7, 2000 | (JP) | 2000-373,039 |
| May 23, 2001 | (JP) | 2001-153,693 |
| Sept. 4, 2001 | (JP) | 2001-267,299 -- |

Item [56], References Cited, OTHER PUBLICATIONS, change "GaN-AlxJGa$_{1-x}$JN" to -- GaN-Al$_x$/Ga$_{1-x}$/N --

Signed and Sealed this

Thirtieth Day of November, 2004

JON W. DUDAS
*Director of the United States Patent and Trademark Office*